(12) United States Patent
Araki et al.

(10) Patent No.: US 7,035,103 B2
(45) Date of Patent: Apr. 25, 2006

(54) CABINET AND ADDITIONAL DEVICE

(75) Inventors: Hideo Araki, Kawasaki (JP); Hiroshi Katagiri, Kawasaki (JP); Yoshiaki Tada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/833,852

(22) Filed: Apr. 28, 2004

(65) Prior Publication Data

US 2005/0135059 A1 Jun. 23, 2005

(30) Foreign Application Priority Data

Dec. 19, 2003 (JP) ............................. 2003-421992

(51) Int. Cl.
*H05K 7/20* (2006.01)
(52) U.S. Cl. ............ 361/695; 361/683; 361/687; 312/223.2; 454/184
(58) Field of Classification Search ........ 361/676–679, 361/683–690, 694, 695, 719–721, 730, 736, 361/741, 796, 727; 174/252; 312/223.2
See application file for complete search history.

(56) References Cited

U.S. PATENT DOCUMENTS

| | | | | |
|---|---|---|---|---|
| 6,038,126 A | * | 3/2000 | Weng | 361/679 |
| 6,052,281 A | * | 4/2000 | Hardt et al. | 361/690 |
| 6,198,633 B1 | * | 3/2001 | Lehman et al. | 361/756 |
| 6,437,980 B1 | * | 8/2002 | Casebolt | 361/687 |
| 6,618,248 B1 | * | 9/2003 | Dalheimer | 361/687 |
| 6,625,033 B1 | * | 9/2003 | Steinman | 361/753 |
| 6,654,894 B1 | * | 11/2003 | Kaminski et al. | 713/300 |
| 6,661,656 B1 | * | 12/2003 | Kim et al. | 361/687 |
| 6,725,132 B1 | * | 4/2004 | Frankel et al. | 700/300 |
| 6,833,995 B1 | * | 12/2004 | Hsue et al. | 361/727 |

FOREIGN PATENT DOCUMENTS

JP 2001-148578 5/2001

* cited by examiner

*Primary Examiner*—Boris Chèrvinsky
(74) *Attorney, Agent, or Firm*—Katten Muchin Rosenman LLP

(57) ABSTRACT

It is an object of the present invention to provide a cabinet capable of containing various devices and securely attaching/detaching an additional device thereto/therefrom, and to provide an additional device. In order to achieve the object, a cabinet according to the present invention includes: a conductive cylinder having an aperture into which the additional device is fitted by insertion and containing an electronic device, the aperture having a folded edge, the additional device operating in parallel with the electronic device; and a reinforcing member supported with a portion of an inner wall of the cylinder and disposed on a boundary between two areas inside the cylinder where the electronic device and the additional device are disposed respectively, the portion of the inner wall being more inside than the folded portion of the aperture.

15 Claims, 12 Drawing Sheets

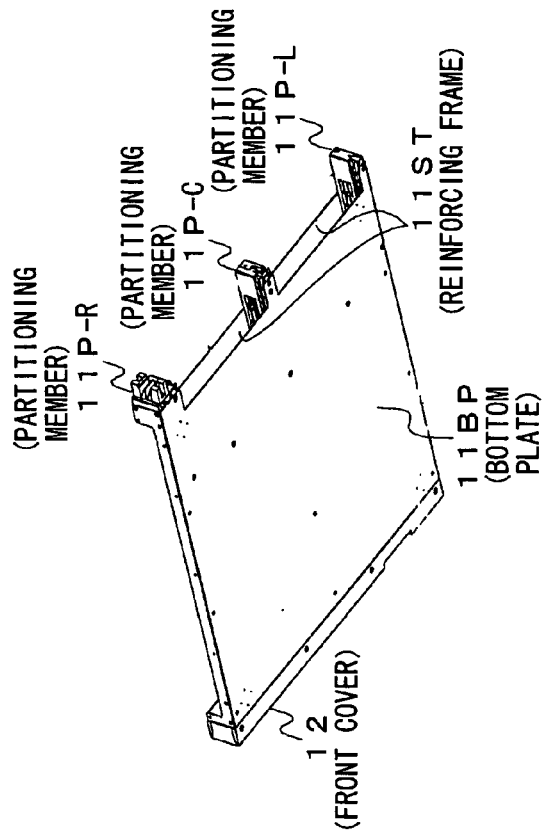
F I G. 3 (b)
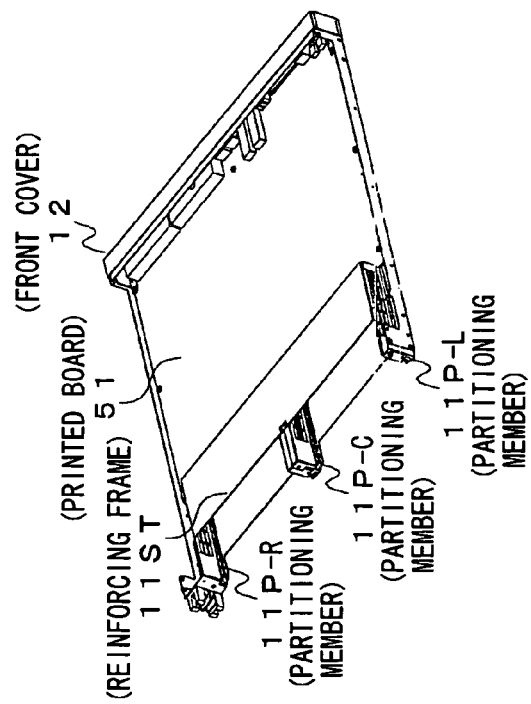
F I G. 3 (a)

F I G. 4 (a)
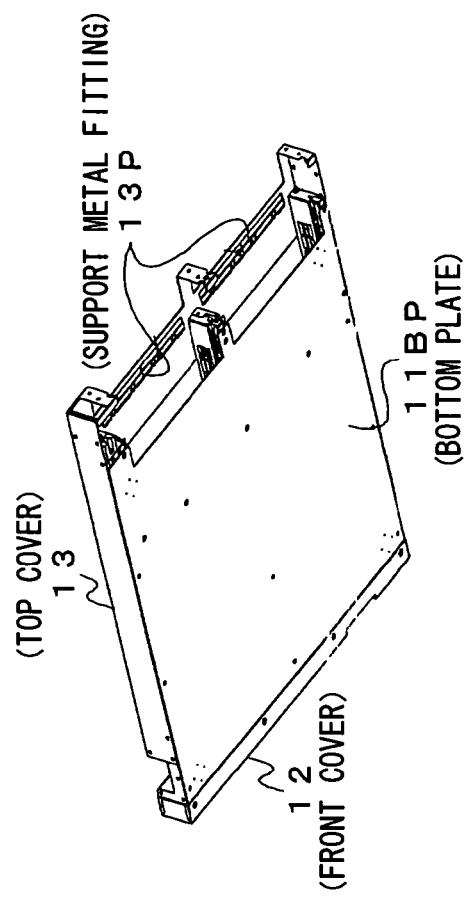
F I G. 4 (b)
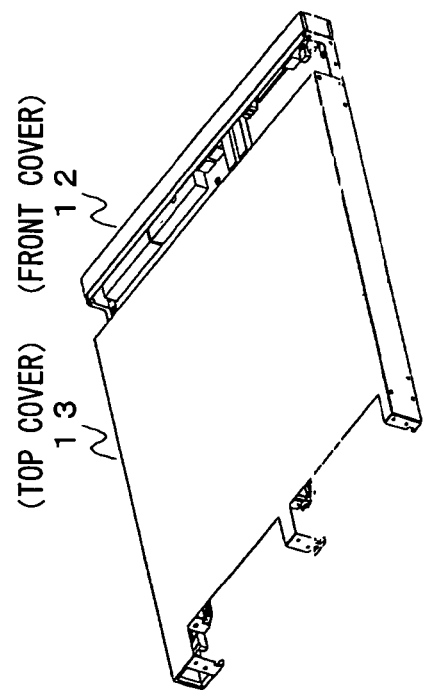

F I G. 6 (a)
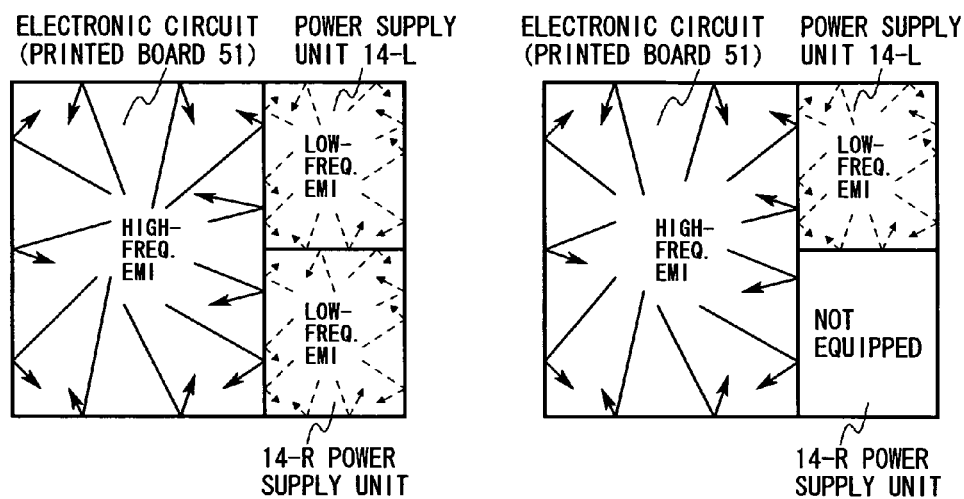
F I G. 6 (b)
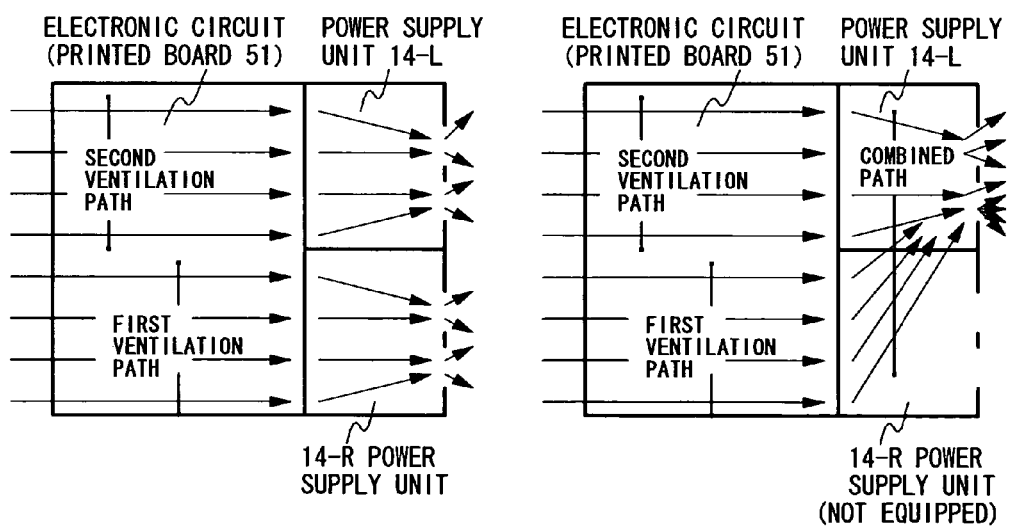

F I G. 9

| SYSTEM CONFIGU-RATION | CURRENT STATE (OPERATION STATE OF POWER SUPPLY CIRCUIT AND FAN) | POWER FOR FAN DRIVING | | LOGICAL VALUE OF CONTROL SIGNAL R | LOGICAL VALUE OF CONTROL SIGNAL L | |
|---|---|---|---|---|---|---|
| | | FAN 14F-R | FAN 14F-L | | | |
| DUPLEX OPERATION | FIRST STATE | SUPPLIED | SUPPLIED | 0 | 0 | (3) |
| | SECOND STATE | SUPPLIED | SUPPLIED | 0 | 0 | (4) |
| | | SUPPLIED | SUPPLIED | 0 | 0 | (5) |
| | THIRD STATE | CUT OFF (SUPPLIED) | SUPPLIED | 1 | 1 | (6) |
| | | SUPPLIED | CUT OFF (SUPPLIED) | 1 | 1 | (7) |
| SINGLE SYSTEM OPERATION | POWER SUPPLY CIRCUIT AND FAN IN NORMAL OPERATION | SUPPLIED | CUT OFF (SUPPLIED) | 1 | 1 | (1) |
| | | CUT OFF (SUPPLIED) | SUPPLIED | 1 | 1 | (2) |

PRIOR ART FIG. 10(a)
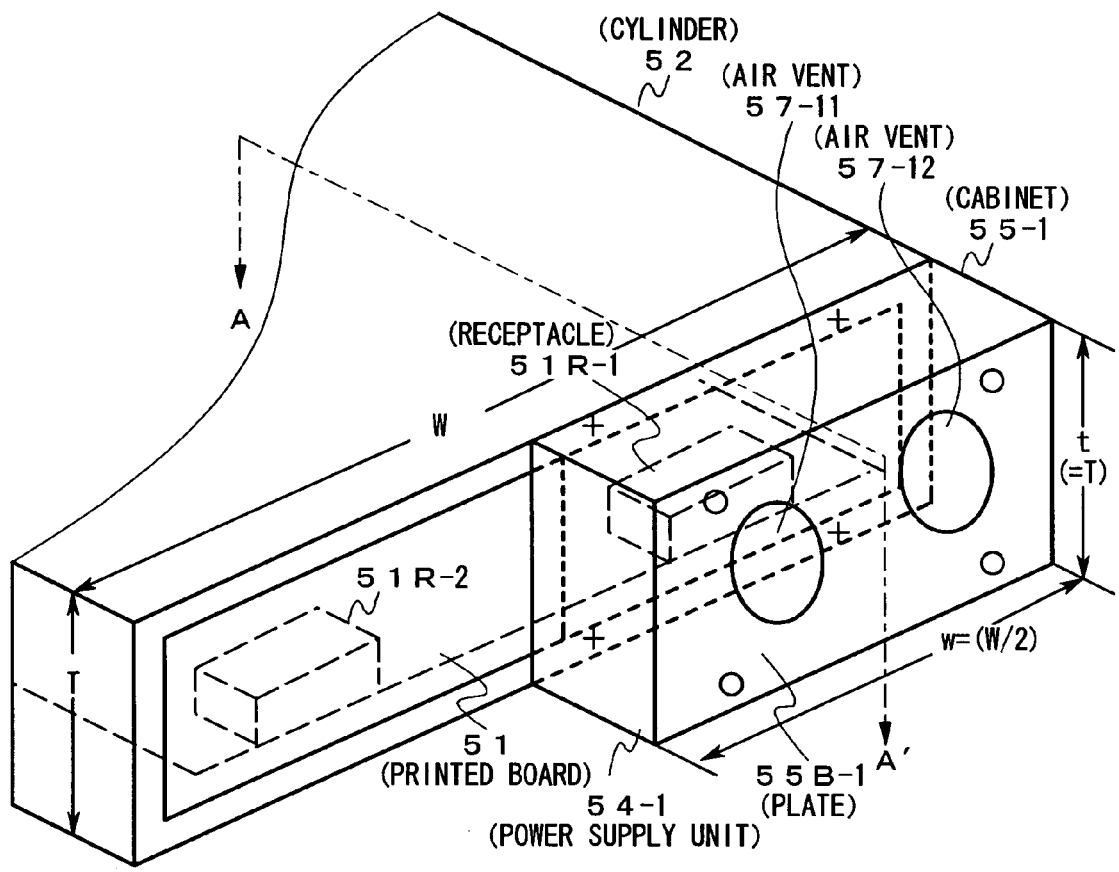
PRIOR ART FIG. 10(b)
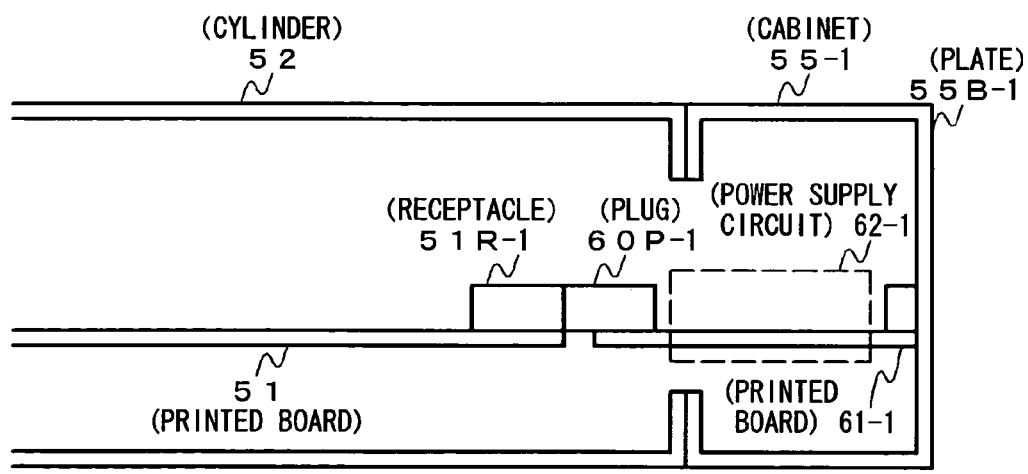
A—A' CROSS SECTION

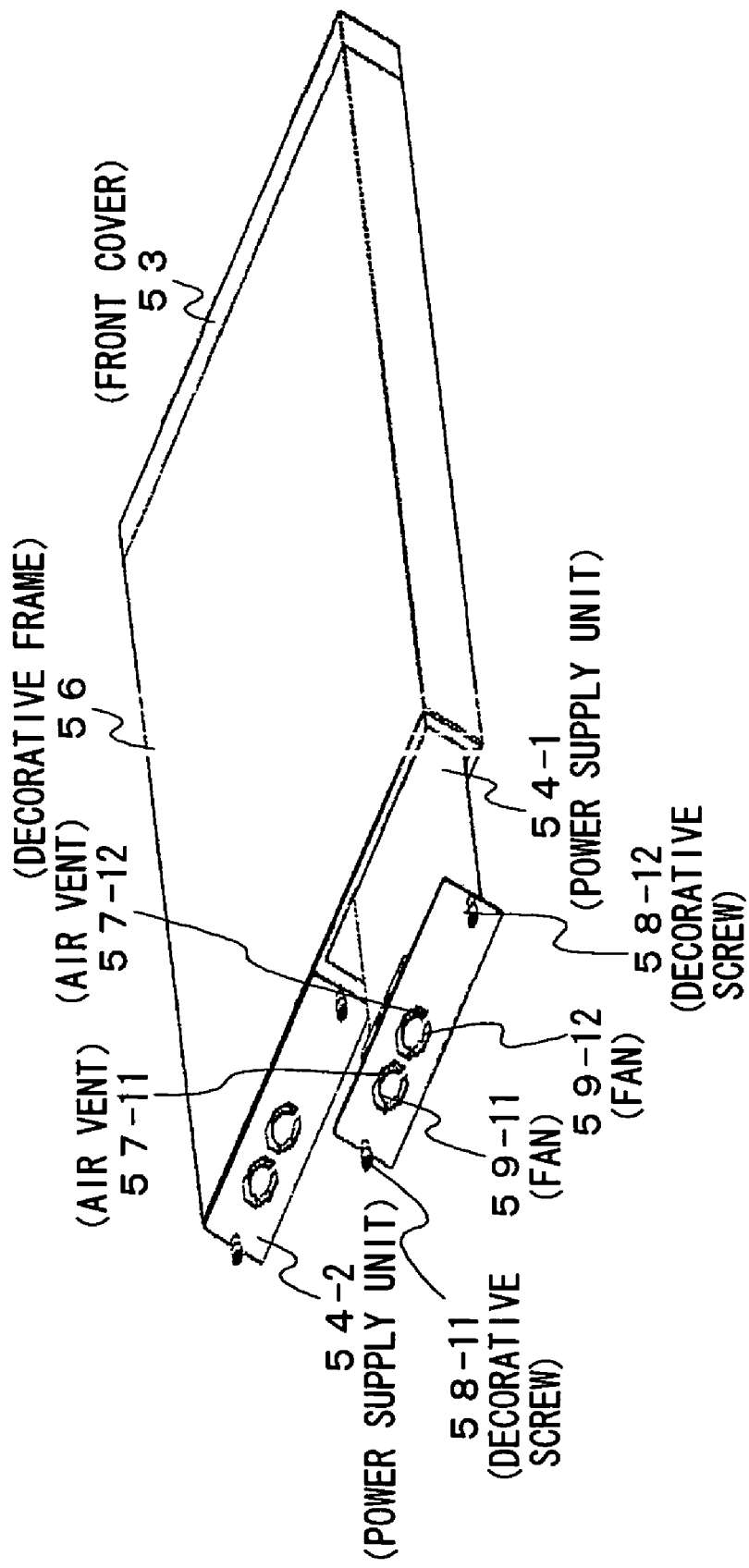
PRIOR ART FIG. 11

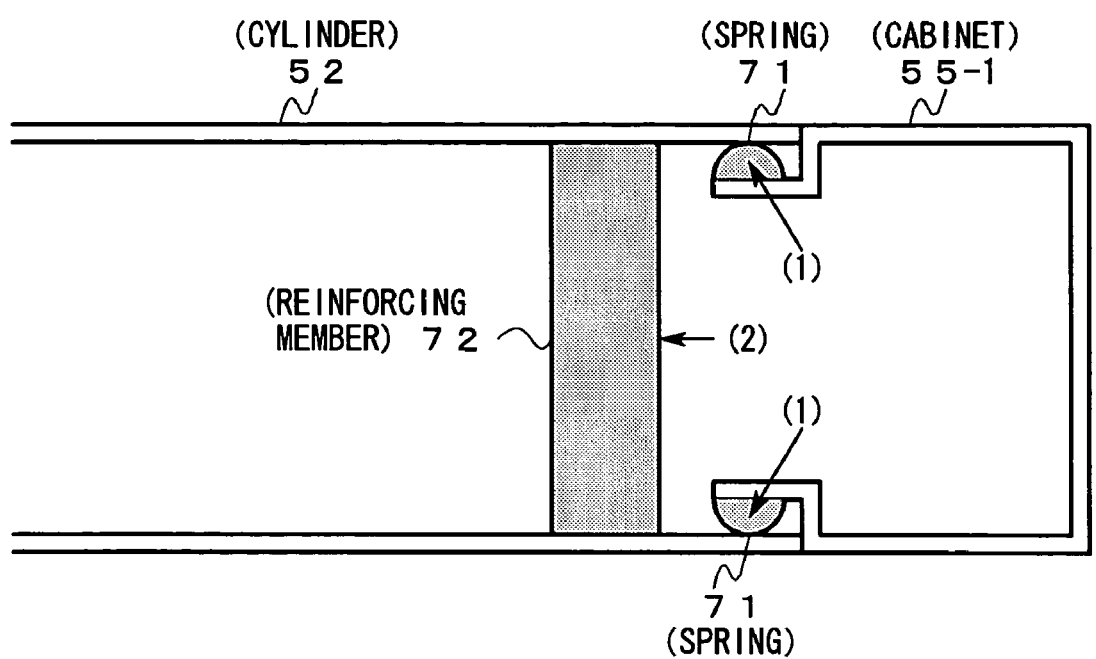
PRIOR ART FIG. 12

CABINET AND ADDITIONAL DEVICE

CROSS REFERENCE TO RELATED APPLICATION

This application is based upon and claims the benefit of priority from Japanese Patent Application No. 2003-421992, filed on Dec. 19, 2003, the entire contents of which are incorporated herein by reference.

BACKGROUND OF THE INVENTION

1. Field of the Invention

The present invention relates to a cabinet configured to contain a desired device and to have, on a side portion thereof, an additional device which operates in association with or in parallel with the desired device, and it relates to the additional device.

2. Description of the Related Art

In recent years, various operators employ cabinets in compliance with the EIA standard or the JIS standard to accommodate many devices such as routers and servers of a data communication network which are given maintenance and expansion when necessary, the cabinet containing these devices together in the same site or office premise (may be a single rack).

FIG. 10(a) and FIG. 10(b) show a structural example (1) of a conventional cabinet.

FIG. 11 shows a structural example (2) of the conventional cabinet.

As shown in FIG. 10(a), FIG. 10(b), and FIG. 11, the conventional cabinet is composed of the following elements:

(1) A cylinder 52 made of metal (aluminum or the like) having: two apertures with one edge folded with a margin of a prescribed width (assumed here to be small to such an extent as not to close the aperture) at a right angle in a direction of the axis of the cylinder; attached thereto a printed board 51 with components constituting a desired device (a router or the like) mounted in a hollow portion thereof; and a cross section thereof in a rectangular shape;

(2) A front cover 53: connected to an electronic circuit (including later-described receptacles 51R-1, 51R-2) on the printed board 51; having attached thereto electronic components used for connection of the electronic circuit to a man-machine interface and to an exterior; fitted (or fastened) to the aperture of the aforesaid cylinder 52 with no folded edge; having in advance a slit or the like corresponding to a ventilation path to the exterior in advance and preventable of radiation of electro magnetic interference generated in the electronic circuit to the exterior;

(3) A decorative frame 56 having a cross section in a substantially U shape and covering the aforesaid cylinder 52 and both of cabinets 55-1, 55-2 (assumed here that a width w thereof is half (=W/2) a width W (<19 inch) of the aforesaid aperture, and a thickness t thereof is equal to a thickness T of this aperture) containing later-described two power supply units 54-1, 54-2 (the power supply unit 54-2 is omitted in FIG. 10(a) and FIG. 10(b) in order to clearly show the inside of the cylinder 52) adjacent to the aperture, the cabinets 55-1, 55-2 being made of metal in a rectangular parallelepiped shape to contain part of the power supply units 54-1, 54-2 respectively.

The aforesaid cabinet 55-1 is formed in the following manner:

(1) A bending margin that is equal in size and shape to the aforesaid bending margin is reserved in an aperture at the one aperture of the cylinder 52, and the bending margin is bent at a right angle in a direction so as to narrow this aperture.

(2) A bottom of the cabinet 55-1 is formed as a detachable metal plate 55B-1.

(3) Two air vents 57-11, 57-12 and two decorative screws 58-11, 58-12 rotatable from an exterior are attached to predetermined positions of the plate 55B-1, and fans 59-11, 59-12 are mounted inside the air vents 57-11, 57-12.

(4) Screw holes formed in the bending margins of the apertures of the cabinet 55-1 and the cylinder 52, for a predetermined number of screws to screw-fix the cabinet 55-1 and the cylinder 52 to each other.

Further, the power supply unit 54-1 is constituted of the following elements:

(1) a printed board 61 fixed to the aforesaid plate 55B-1 at one end and having at the other end thereof a plug 60P-1 fitted to the receptacle 51R-1; and (2) a power supply circuit 62-1 formed on the printed board 61-1 to supply power to the circuit disposed on the printed board 51 via the aforesaid plug 60P-1 and receptacle 51R-1 and to drive the fans 59-11, 59-12.

Since the structures of the power supply units 54-2 and the cabinet 55-2 are the same as those of the power supply unit 54-1 and the cabinet 55-1 respectively, explanation and illustration thereof will be omitted here, and the same reference numerals and symbols with a suffix number '2' instead of '1' will be used to designate corresponding portions.

A device including the cabinet as configured above is assembled in the following procedure.

(1) The printed board 51 whose assembly has been finished is mounted in the hollow portion of the cylinder 52.

(2) The front cover 53 is attached to the other aperture of the cylinder 52.

(3) The decorative screws 58-11, 58-12, 58-21, 58-22 are screwed off from the power supply units 54-1, 54-2 whose assembly has been finished, and the plates 55B-1, 55B-2 are detached from the bottoms of the cabinets 55-1, 55-2. It is assumed that even during this process, power supply routes to the fans 59-11, 59-12 are kept via lead wires connected to the power supply circuits 62-1, 62-2 respectively.

(4) Screws used for screw-fixing the apertures of the cabinets 55-1, 55-2 to the one aperture of the cylinder 52 from the bottom (holes formed by the aforesaid detachment of the plates 55B-1, 55B-2) side of the cabinets 55-1, 55-2.

(5) The bottoms of the cabinets 55-1, 55-2 are closed with the plates 55B-1, 55B-2 through performing the above procedure in reverse (3).

(6) The decorative frame 56 is placed to cover an external wall except bottom faces of the cabinets 55-1, 55-2 and the cylinder 52.

A prior art to enhance or maintain high stiffness of a cabinet similarly to the present invention is disclosed in, for example, Japanese Unexamined Patent Application Publication No. 2001-148578.

In the above-described conventional example, in order to prevent radiation of electronic magnetic interference generated in the electronic circuit disposed on the printed board 51 to the exterior of the cabinet, it is necessary to electrically tightly connect the cylinder 52 to the cabinets 55-1, 55-2 by the aforesaid screw-fixing or to similarly maintain stable and close electrical connection between the cylinder 52 and the cabinets 55-1, 55-2 via conductive springs 71 or the like as shown by (1) in FIG. 12.

Further, the springs 71 give a strong pressure to the apertures of the cylinder 52 and the cabinets 55-1, 55-2. Generally, however, the cylinder 52 and the cabinets 55-1, 55-2 are preferably thin and made of light-weight metal so that the cylinder 52 is required to have a reinforcing member 72 at least near the aperture in order to prevent it from deforming against the pressure as shown by (2) in FIG. 12.

However, the bending margin of the aperture of the cylinder 52 reduces the volume of an available space in the hollow portion of the cylinder 52 in which desired components including the aforesaid printed board 51 are disposed. In addition, even without such a bending margin, the available space is narrowed by the aforesaid reinforcing member 72 and the springs 71, which possibly prevents desired high density assembly and downsizing of the cylinder.

Moreover, in the conventional example, the cylinder 52 and the cabinets 55-1, 55-2 are electrically closely coupled in order to suppress radiation of the electro magnetic interference in a high-frequency band ranging from several mega hertz to several gigahertz generated in the electronic circuit on the printed board 51 and of the electro magnetic interference in a bandwidth of several hundred kilohertz or less generated in the power supply circuits 62-1, 62-2 during the process of voltage conversion by switching.

Therefore, for example, with the power supply unit 54-2 detached for replacement or not mounted, the power supply and forced air cooling relies on the power supply unit 54-1, so that an expensive shield has to be provided in order to prevent the radiation of the electro magnetic interference in a high-frequency band.

Moreover, in the conventional example, the heat release efficiency of the electronic circuit lowers if either of the power supply units 54-1, 54-2 is not mounted or either of the fans incorporated therein is in fault. Therefore, it is required to set the performance or the rotation speed of the fans 59-11, 59-12, 59-21, 59-22 with a sufficient margin so as to maintain the operational temperature of the electronic circuit while the power is continuously supplied to the electronic circuit.

Generally, when power supply units to be plugged into the cabinets of individual devices do not incorporate fans, the larger the number of devices contained in the rack and the thinner the thickness of the cabinets in which the bodies of the devices are mounted, with higher assembly density many power supply units and fans are mounted. Besides, it is difficult to make air exhaustion or suction in the same direction by the fans.

In such a case, it is likely that the size of the cabinets of the devices contained in the same rack increases since the rack needs to have complex ventilation paths for the purpose of compensating or adapting to the exhaustion and suction in various directions.

SUMMARY OF THE INVENTION

It is an object of the present invention to provide a cabinet that can contain various devices and to which a desired additional device closely related to the contained devices is detachably, securely attached, without great increase in manufacturing cost or any structural complication, and to provide the additional device.

It is another object of the present invention to reduce the weight and size of a device and a system to which the present invention is applied and realize high density assembly thereof as well as to make the device and system be adaptable to various system configurations, without increasing manufacturing cost and restrictions on thermal design, and complexing the structure.

It is still another object of the present invention to stably and securely attach/detach the additional device to/from the cylinder (also referred to herein as a housing) of the cabinet even if the thickness or hardness of the cylinder is small because the cabinet of the additional device can have a resisting force against bending force physically acting on or around the aperture of the cylinder.

It is yet another object of the present invention to make a desired device contained in the cabinet of the present invention adaptable to not only various shapes and dimension of additional devices but also the system configurations and conditions thereof and to prevent abrupt or great decrease in efficiency of forced air cooling of an electronic device contained in the cylinder.

It is yet another object of the present invention to maintain high efficiency of the aforesaid forced air cooling without setting performance of a fan provided in each of the additional devices to an unnecessarily high level, or consuming large power for driving the fans.

It is yet another object of the present invention to improve efficiency and availability of the cabinet and additional device with regard to the maintenance and operation thereof and to enhance total reliability thereof.

It is yet another object of the present invention to increase, compared with conventional examples, upper limit values of the volumes of an electronic device contained in a cylinder and of an additional device attached to the aperture of the cylinder, or to decrease the size of the cabinet of the present invention and change the shape thereof freely.

It is yet another object of the present invention to suppress or reduce electro magnetic interference caused by an electronic device even while an additional device is not inserted into the aperture of the cylinder.

It is yet another object of the present invention to closely fit, with a strong pressure, the cabinet of an additional device into the aperture of a cabinet containing an electronic device with low cost and without structural complication, compared with a case where stiffness of the aperture of the cabinet containing the electronic device is not reinforced with having a folded edge.

It is yet another object of the present invention to make it possible to not only replace power sources according to difference or increase/decrease in load of electronic devices but also standardize the structure of the power sources and electronic devices.

It is yet another object of the present invention to perform air exhaustion or suction in the same direction or in an integrated manner with easiness during a process of forced air cooling of an electronic device.

The present invention is applied as follows.

A first cabinet according to the present invention has a conductive cylinder containing an electronic device. The cylinder has an aperture with a folded edge. Further, an additional device operating in parallel with the aforesaid electronic device is fitted into this aperture. A reinforcing member is supported with a portion of an inner wall of the cylinder and disposed on a boundary between two areas in the cylinder where the electronic device and the additional device are placed, respectively. The portion of the inner wall is more inside than a folded edge of the aperture.

Therefore, folding the edge of the aperture of the cylinder can increase the stiffness of the aperture, and the provision of the reinforcing member also heightens the physical strength of the inner wall of the cylinder including the vicinity of the folded portion of the aperture, even though the aperture is given pressure in an outward direction from the cabinet of the inserted additional device. Consequently, It is possible to stably and securely attach/detach the additional device to/from the cylinder even if the thickness or hardness of the cylinder is small because the cabinet of the additional device can have a resisting force against bending force physically acting on or around the aperture of the cylinder.

A second cabinet according to the present invention includes a conductive cylinder containing an electronic device. The cylinder has an aperture with a folded edge. Further, a plurality of additional devices operating in parallel with the aforesaid electronic device are fitted into the aperture with a folded edge. A reinforcing member is supported with a portion of an inner wall of this cylinder, and disposed on a boundary between two areas in the cylinder where the electronic device and all of the plurality of additional devices are placed, respectively. The portion of the inner wall is more inside than the folded edge of the aperture.

Therefore, folding the edge of the aperture of the cylinder can increase the stiffness of the aperture, and the provision of the reinforcing member also heightens the physical strength of the inner wall of the cylinder including the vicinity of the folded portion of the aperture, even though the aperture is given pressure in an outward direction from the cabinet of the inserted additional devices. Consequently, It is possible to stably and securely attach/detach the additional devices to/from the cylinder even if the thickness or hardness of the cylinder is small because the cabinet of the additional device can have a resisting force against bending force physically acting on or around the aperture of the cylinder.

A third cabinet according to the present invention includes a partitioning member which partitions the aforesaid aperture into areas into which the additional devices are fitted and is a bypass path for forced air cooling in these areas. Each of the plurality of additional devices has a fan used for the forced air cooling of the electronic device.

In other words, the partitioning member helps normally operating fans, of the fans provided in the aforesaid plural devices, distribute load of the forced air cooling even though the aperture of the cylinder is divided into a plurality of apertures in conformity with the shapes and dimensions of the devices inserted into the aperture. This makes it possible to allow a desired device contained in the cabinet of the present invention to be adaptable to not only various shapes and dimensions of additional devices but also the system configurations and conditions thereof and to prevent abrupt or great decrease in efficiency of forced air cooling of an electronic device contained in the cylinder.

A fourth cabinet according to the present invention includes a control unit which increases/decreases rotation speed of the fans provided in the plurality of additional devices, according to the number of the fans or operational conditions of the fans, to maintain efficiency of the forced air cooling within a prescribed range. In other words, fans provided in additionally devices actually mounted on the cabinet and normally operating can compensate all or part of loads of the forced air cooling if some of the plurality of additional devices are not actually mounted on the cabinet or they are mounted but the fans therein do not normally operate. Consequently, it is possible to maintain high efficiency of the aforesaid forced air cooling without setting performance of a fan provided in each of the additional devices to an unnecessarily high level, or consuming large power for driving the fans.

In a fifth cabinet according to the present invention, the cylinder includes a covering member having an edge that is all or part of the edge of the aforesaid aperture, and used for opening/closing the above-mentioned two areas, and detachably supporting the reinforcing member. Therefore, with the aforesaid covering member detached, it is more facilitated to attach/detach, adjust, inspect and so on the electronic device and additional devices than with no provision of such a covering member. Consequently, it is able to improve the efficiency and availability of the cabinet of the invention with regard to maintenance and operation and to enhance total reliability thereof.

In a sixth cabinet according to the present invention, the reinforcing member adjacent to the covering member has a specific edge which is shaped to be in parallel with the covering member. The covering member has a member to pinch the specific edge. Therefore, without any large member attached inside the cylinder it is able to give to the aperture stiffness and physical strength enough to securely, stably have the additional device attached thereto with low cost. Consequently, it is possible to increase, compared with conventional examples, upper limit values of the volumes of the electronic device contained in the cylinder and of the additional device attached to the aperture of the cylinder, or to decrease the size of the cabinet of the present invention and change the shape thereof freely.

In a seventh cabinet according to the present invention, the reinforcing member has an opening for heat release from the electronic device to the aforesaid aperture and for suppression of radiation of electro magnetic interference generated in the electronic device to the aperture. The reinforcing member acts as a shielding member to suppress the radiation of the electro magnetic interference generated in the electronic device without obstructing heat release from the electronic device. This makes it possible to suppress or reduce the electro magnetic interference by the electronic device even while the additional device is not inserted into the aperture of the cylinder.

A first additional device according to the present invention includes a first conductive cabinet containing an electronic device. The first conductive cabinet is provided with a second conductive cabinet having a first aperture to be fitted by inserting into an aperture with a folded edge. The second conductive cabinet further contains a circuit that operates in parallel with the electronic device. The first aperture of the conductive cabinet containing the circuit has a shape and dimension and made of materials to be fitted into the aforesaid aperture of the conductive cabinet with the folded edge containing the electronic device. Consequently, given a strong pressure, the above-mentioned aperture insertion is tightly made with low cost, without structural complication, compared with a case where stiffness of the aperture of the cabinet containing the electronic device is not reinforced with having a folded edge.

A second additional device according to the present invention has a circuit to supply power to the electronic device. In this case the power source to supply power to the electronic device is contained as an additional device in another cabinet that is to be fitted into the aperture of the first cabinet containing the electronic device. This makes it possible to replace the power source according to difference or increase/decrease in load among the electronic devices as well as to standardize the structure of the power source and electronic device, compared with a case where such a power source is integrally incorporated in the electronic device.

A third additional device according to the present invention uses a fan for forced air cooling of the electronic device via the first aperture. In other words the additional device contained in another cabinet fitted into the aperture of the cabinet containing the electronic device includes the fan used for the forced air cooling of the electronic device in addition to the circuit for supplying power to the electronic device. This realizes reduction in the types and number of the additional devices to be contained in another cabinet, and also realizes exhaustion or suction in the same direction, or integration of the exhaustion and suction during the process of the aforesaid forced air cooling the directions.

In a fourth additional device according to the present invention, the second conductive cabinet of the above-described third additional device has a second aperture to serve as a bypass path for ventilation in the process of the forced air cooling which is provided between the additional device and another additional device disposed adjacent to the additional device. When another additional device is disposed adjacent to the additional device according to the present invention, and one of the fans provided in these additional devices is in fault or in halt, the other fan in normal operation can compensate all or part of loads of the forced air cooling via the second aperture. This enables a desired device contained in the cabinet of the invention to be adaptable to not only various shapes and dimensions of the additional devices but also various system configurations and operational conditions thereof. Also, this results in preventing abrupt or great decrease in efficiency of the aforesaid forced air cooling.

A fifth additional device according to the present invention additionally includes a control unit which increases/decreases the rotation speed of fans according to operational conditions of the fans provided in a specific additional device of the present invention and in another additional device that is fitted into the aperture of the first cabinet, to maintain efficiency of the forced air cooling within a prescribed range. Accordingly, the fans provided in actually mounted additional devices and normally operating are able to compensate all or part of loads of the forced air cooling if some of the additional devices are not mounted or the fans in the mounted devices do not normally operate. Consequently, it is possible to maintain high efficiency of the forced air cooling without setting the performance of the fans to an unnecessarily high level, or consuming large power for driving these fans.

BRIEF DESCRIPTION OF THE DRAWINGS

The nature, principle, and utility of the invention will become more apparent from the following detailed description when read in conjunction with the accompanying drawings in which like parts are designated by identical reference numbers, in which:

FIG. 3(a) and FIG. 3(b) show the detailed inner structure of the first to third embodiments of the present invention;

FIG. 4(a) and FIG. 4(b) show the process of opening/closing a cabinet according to the first to third embodiments of the present invention;

FIG. 6(a) and FIG. 6(b) are charts to explain the operation of the first and second embodiments of the present invention

FIG. 9 is a table to explain the operation of the third embodiment of the present invention;

FIG. 10(a) and FIG. 10(b) show a structural example (1) of a conventional cabinet;

FIG. 11 shows a structural example (2) of the conventional cabinet; and

FIG. 12 shows a problem of the conventional example.

DESCRIPTION OF THE PREFERRED EMBODIMENTS

Hereinafter, embodiments of the present invention will be explained in detail based on the drawings.

Figure 1:
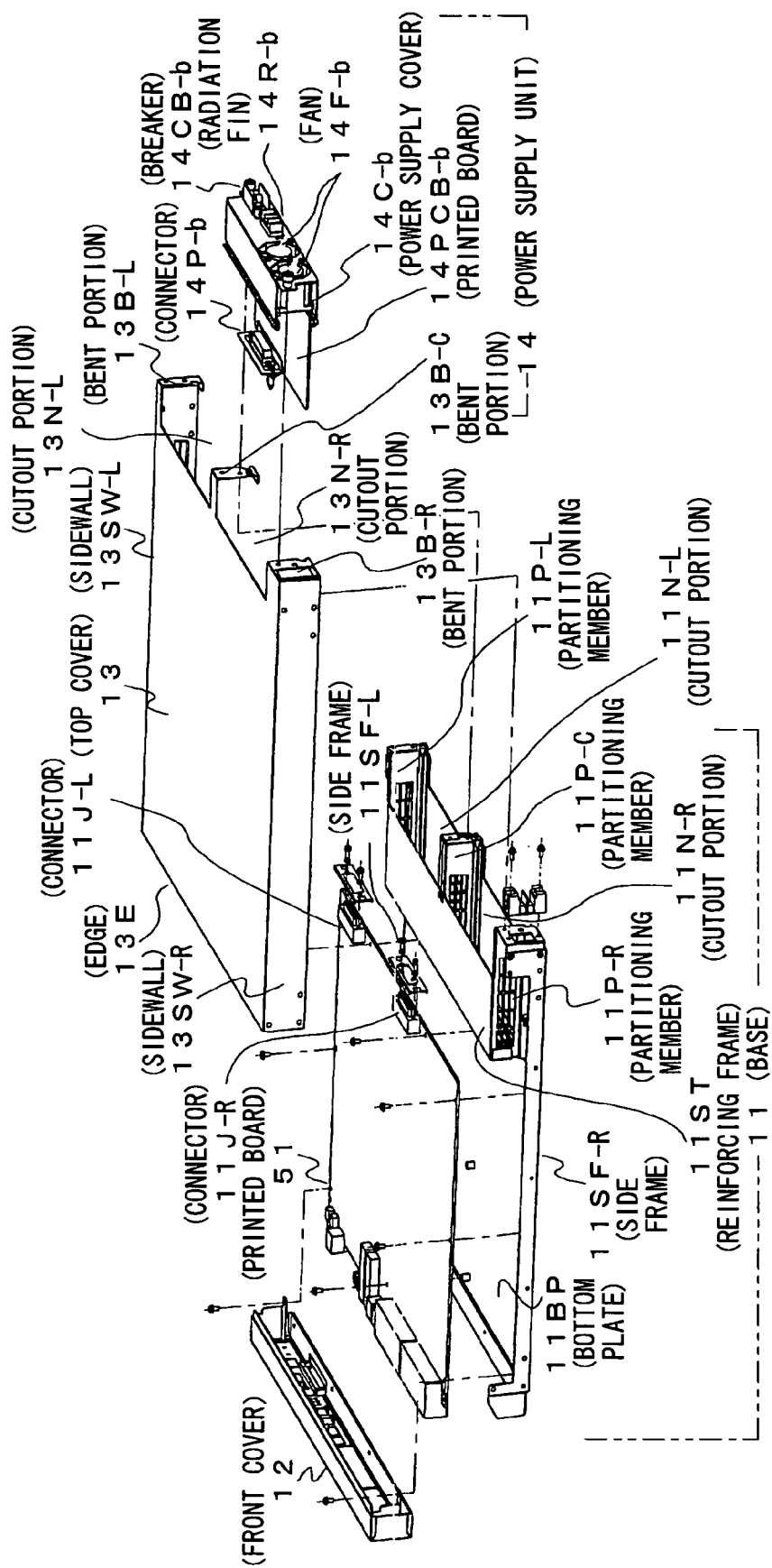
FIG. 1 is an assembly view of first to third embodiments of the present invention.

FIG. 1 is an assembly view of a first to a third embodiment of the present invention.

Figure 2:
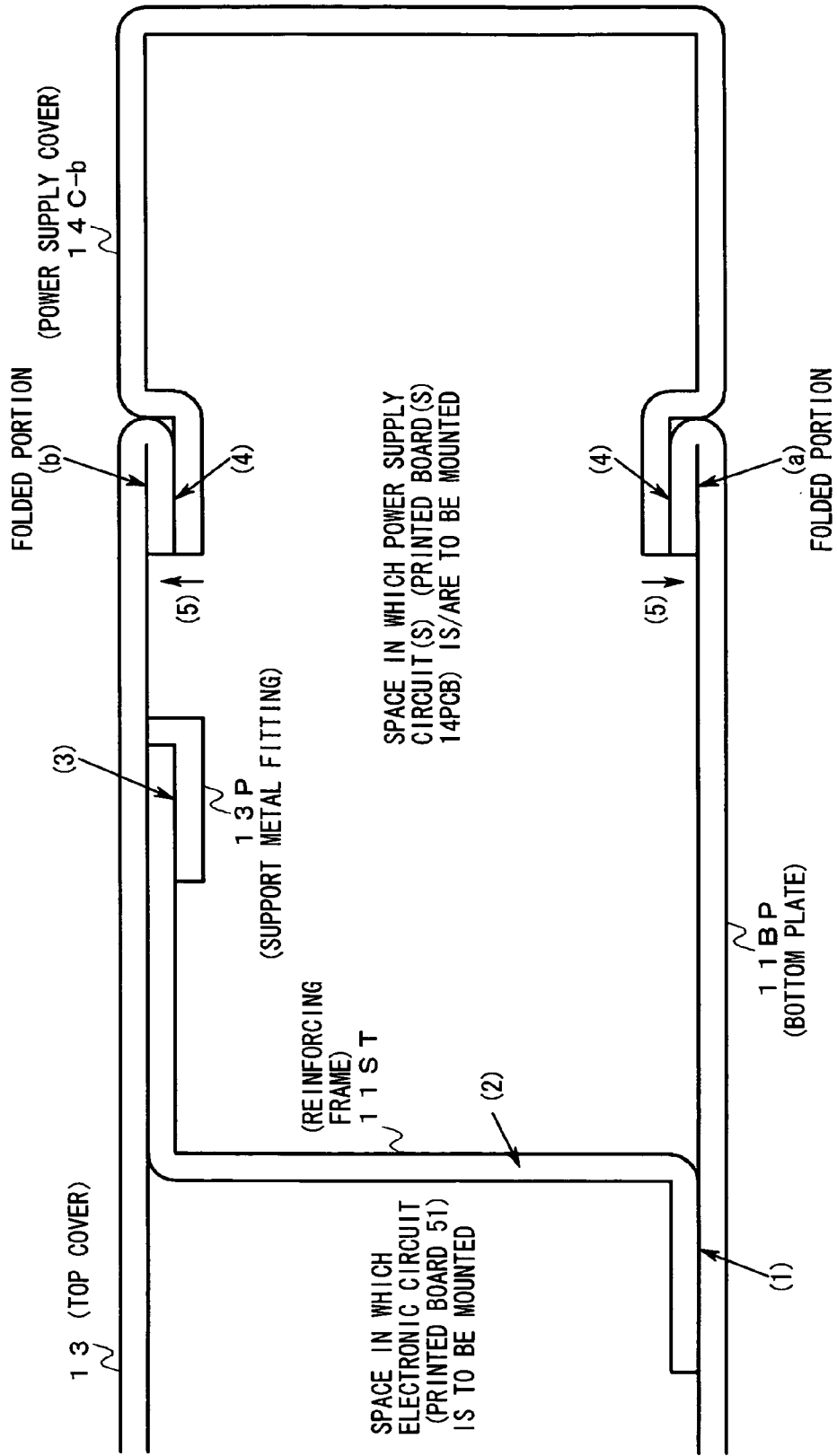
FIG. 2 is a cross sectional view of an essential part of the first to third embodiments of the present invention.

FIG. 2 is a cross sectional view of an essential part of the first to third embodiments of the present invention.

FIG. 3(a) and FIG. 3(b) are views showing the state in which a top cover is detached from a cabinet according to the first to third embodiments of the present invention.

FIG. 4(a) and FIG. 4(b) are views showing the process of opening/closing the cabinet according to the first to third embodiments of the present invention.

Figure 5:
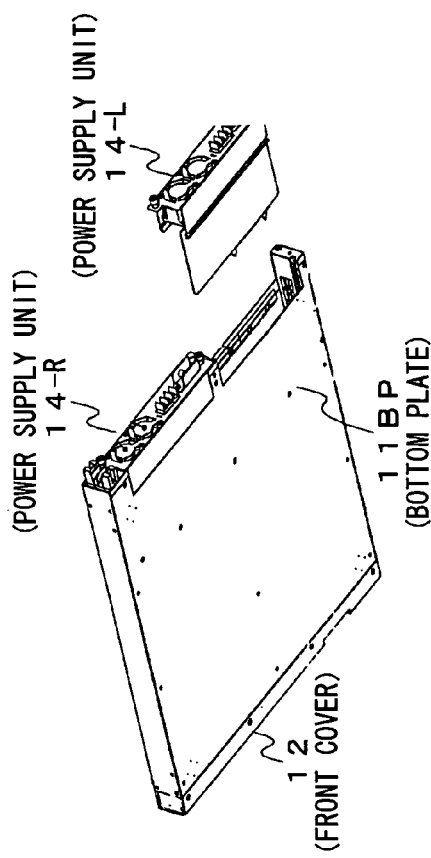
FIG. 5(a) and FIG. 5(b) show the process of mounting a power supply unit in the first to third embodiments of the present invention.
Figure 5:
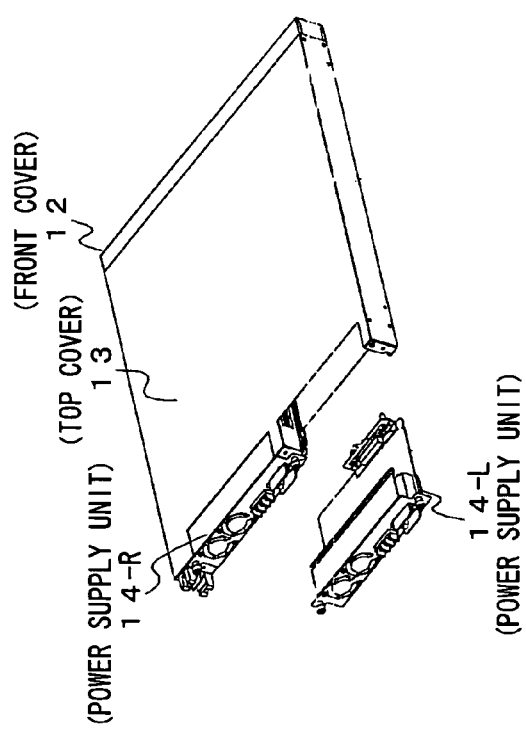

FIG. 5(a) and FIG. 5(b) are views showing the process of mounting a power supply unit in the first to third embodiments of the present invention.

As shown in FIG. 1 to FIG. 5(b), the cabinet according to the first to third embodiments of the present invention is composed of a base 11, a front cover 12, and a top cover 13, and the basic structures of the base 11, front cover 12, and top cover 13 are as follows.

The base 11 is composed of the following elements:

a bottom plate 111 BP being a rectangular metal plate having screw holes used for fixing the aforesaid printed board 51, and two rectangular cutout portions 11N-R, 11N-L, in one of shorter sides thereof, arranged symmetrical with respect to the center of the shorter side, and the metal plate being used for grounding an electronic circuit disposed on the printed board 51;

a pair of side frames 11SF-R, 11SF-L being metal plates in a substantially U shape and joined to two longer sides of the aforesaid bottom plate 111 BP respectively;

partitioning members 11P-R, 11P-C, 11P-L being made of metal or metal pieces in a rectangular parallelepiped shape having later-described first slits in lattice, and having the same length to set an interval between themselves and the printed board 51 to a predetermined value, and protrudingly provided in parallel with the longer sides of the bottom plate 11BP with their ends on three protruding portions, which are other than the aforesaid cutout portions 11N-R, 11N-L, on the aforesaid shorter side of the bottom plate 11BP; and a reinforcing frame 11ST: joined to the bottom plate 11BP ((1) in FIG. 2) with its one end; being a molded metal plate in a substantially L shape ((2) in FIG. 2) including all of one ends and a predetermined length of top portions of the partitioning plates 11P-R, 11P-C, 11P-L; fixed to the partitioning members 11P-R, 11P-C, 11P-L by screwing or the like; and having later-described second slits in lattice.

Note that it will be hereinafter assumed that later-described connectors 11J-R, 11J-L are disposed on the printed board 51 in addition to the aforesaid circuit.

The front cover 12 has the following structure.
(1) It is formed as a molded conductive member with a shape and dimension to suppress radiation of electro magnetic interference caused by components on the printed board 51 used for man machine interface via the front cover 12.
(2) It has a groove fitted to one shorter side of the bottom plate 11BP and to edges of the side frames 11SF-R, 11SF-L, more specifically, edges continuing from or close to this shorter side, and it also has a later-described suction port.

The top cover 13 is formed by machining a metal plate as follows.
(1) A pair of sidewalls 13SW-R, 13SW-L are formed, which are fixable to the side frames 11SF-R, 11SF-L by screws and slidable along external walls of the side frames 11SF-R, 11SF-L.
(2) Bent portions 13B-R, 13B-L are formed that are abuttable on and screw-fixable to one ends of the partitioning members 11P-R, 11P-L, and coupled to the aforesaid sidewalls 13SW-R, 13SW-L respectively.
(3) Cutout portions 13N-R, 13N-L and a bent portion 13B-C are formed, positioning at the boundary between the cutout portions 13N-R, 13N-L, the cutout portions being abuttable on and screw-fixable to one end of the partitioning member 11P-C and formed by extending the aforesaid cutout portions 11N-R, 11N-L toward a top portion of the top cover 13.
(4) An edge 13E is formed that has a cross section in a substantially U shape and is fittable to the front cover 12 together with the bottom plate 11BP and the side frames 11SF-R, 11SF-L.

Further, detachable power supply units 14-R, 14-L (also referred to herein as additional devices) are mounted in the aforesaid pair of cutout portions 11N-R, 13N-R and pair of cutout potions 11N-L, 13N-L, and the power supply units 14-R, 14-L are composed of the following elements. Note that what are common to the power supply units 14-R, 14-L are hereinafter denoted by reference numerals of corresponding elements with a suffix 'b' that can represent both the suffixes R and L.
(1) A power supply cover 14C-b: formed of a metal plate which is bent in a U shape and whose edge is molded in a shape to be fitted into the cutout portions 11N-b, 13N-b; used for grounding a later-described power supply circuit; and having a fan 14F-b, a radiation fin 14R-b, a breaker 14CB-b, and so on attached to a top portion thereof.
(2) a printed board 14PCB-b: fixed to the power supply cover 14C-b; and on which disposed are a power supply circuit including the aforesaid radiation fin 14R-b and the breaker 14CB-b, a control circuit for driving the aforesaid fan 14F-b, and a connector 14P-b used for connection to physical lines necessary for power supply to the circuit disposed on the printed board 51 and for association with this circuit (both are achieved via the aforesaid connector 11J-b).

Note that an exhaust port formed in the top portion of the power supply cover 14C-b and used for exhaust via the fan 14F-b is constituted as a set of slits that satisfy the same conditions as those of later-described first slits, or covered with a net-shaped member having such slits that are formed in advance.

[First Embodiment]

FIG. 6(a) and FIG. 6(b) are charts to explain the operation of the first and second embodiments of the present invention.

Hereinafter, the first embodiment of the present invention will be explained with reference to FIG. 1 to FIG. 6(b).

Edges of the bottom plate 11BP and the top cover 13 in which the cutout portions 11N-b, 13N-b are formed respectively are folded with predetermined margins as shown in (a) and (b) in FIG. 2. Hereinafter, these edges will be referred to as folded portions.

Further, as shown in FIG. 2, a support metal fitting 13P is attached to an inner wall of the top cover 13 which is distant from the folded portion with a predetermined length. The support metal fitting 13P is a metal piece with a shape and dimension to insert the reinforcing frame 11ST thereto and support the edge.

The power supply cover 14C-b is formed in a shape and dimension and of a material so as to ensure elasticity and stiffness to attach/detach the power supply unit 14-b (also referred to herein as an additional device) from/to the edge thereof (hereinafter, referred to as an inserted portion) which is inserted into a space between the aforesaid folded portions of the bottom plate 11BP and the top cover 13.

An assembly process of the cabinet according to this embodiment is as follows:
(1) As shown in FIG. 3(a) and FIG. 3(b), the printed board 51 (a desired electronic circuit whose basic operation check has been finished is incorporated thereon) is mounted on the bottom plate 11BP, and the front cover 12 is fitted to the bottom plate 11BP by insertion.
(2) The inner wall of the top cover 13 slides along the external walls of the side frames 11SF-R, 11SF-L and the top portion of the reinforcing frame 11ST (the partitioning members 11P-R, 11P-C, 11P-L) as shown in FIG. 4(a) and FIG. 4(b). The top cover 13 (which corresponds to the specific edge of the reinforcing member described in a sixth cabinet according to the present invention and the cabin in claim 7) is fitted with the front cover 12 as shown in FIG. 5(a) and FIG. 5(b), and the top cover 13 has the support metal fitting 13P on its inner wall to pinch the edge of the reinforcing frame 11ST between the inner wall and the support metal fitting 13p shown in (3) in FIG. 2.
(3) The top cover 13 (including the aforesaid bent portions 13B-R, 13B-C, 13B-L) is screw-fixed to the side frames 11SF-R, 11SF-L and the partitioning members 11P-R, 11P-C, 11P-L.
(4) The printed board 14PCB-b is inserted into an aperture as the cutout portion 11N-b or 13N-b between the partitioning members 11P-R, 11P-C (or 11P-C, 11P-L), thereby fitting the aforesaid connector 14P-b with the connector 11J-b (mounted on the printed board 51) and inserting a portion of the power supply cover 14C-b into a space between the aforesaid folded portions of the bottom plate 111 BP and the top cover 13 ((4) in FIG. 2).

In the cabinet thus assembled, the folded portions of the bottom plate 11BP and the top cover 13 is given a pressure in an outward direction of the cabinet by the inserted portion of the power supply covers 14C-b ((5) in FIG. 2). However, the folded portions are folded in a the above-described manner so that when they can have strength large enough to resist a physically acting bending force thereon due to the inserted power supply cover 14C-b, even when the bottom plate 11BP and the top cover 13 are made of thin metal plates.

Further, in the vicinity of the folded portion of the top cover 13, a portion of the reinforcing frame 11ST is inserted into an area sandwiched by the inner wall of the top cover 13 and the support metal fitting 13P. The reinforcing frame 11ST is fixed to the bottom plate 11BP, the top portions of the partitioning plates 11P-R, 11P-C, 11P-L attached to the bottom plate 11BP, so that it is possible to prevent or sufficiently reduce the bending due to the aforesaid pressure with high reliability even when the bottom plate 11BP and the top cover 13 are made of thin metal plates.

Further, the partitioning members 11P-R, 11P-C, 11P-L includes the first slits with a pitch having such a shape and dimension as to suppress radiation of: electro magnetic interference to the power supply unit 14-*b*, the electromagnetic magnetic interference (hereinafter, referred to as high-frequency electromagnetic interference) generated in the electronic circuit disposed on the printed board 51 and having a higher frequency band that is higher than that of electro magnetic interference (hereinafter, referred to as low-frequency electro magnetic interference) generated in the power supply circuit provided in the power supply unit 14-*b*; and contrariwise, the low-frequency electro magnetic interference to the printed board 51 (FIG. 6(*a*)).

The reinforcing frame 11ST has second slits with such a shape and dimension and at a pitch as to satisfy both of the following conditions.

(1) To suppress the radiation of both of the high-frequency electro magnetic interference to the power supply unit 14*b* and of the low-frequency electro magnetic interference to the printed board 51 (FIG. 6(*a*)).

(2) Not to obstruct the airflow through ventilation paths (from the suction port formed in the front cover 12 to the fans 14F-R, 14F-L) for the aforesaid forced air cooling of the electronic circuit, and the degree of obstruction being allowably low.

The inserted portion of the power supply cover 14C-*b* is in physically and electrically close contact with the folded portions of the top cover 13 since the physical strength of the folded portions of the top cover 13 is secured by the folding as described above and a resisting force against the bending of the top cover 13 is ensured by engaging the support metal fitting 13P with the edge of the reinforcing frame 11ST.

Therefore, it is possible to reliably suppress the radiation of the low-frequency electro magnetic interference generated in the power supply cover 14C-*b* to the exterior from spaces which are surrounded by the bottom plate 11BP, the reinforcing frame 11ST, the partitioning members 11P-R, 11P-C (11P-C, 11P-L), and in which the power supply units 14-*b* are to be mounted, respectively.

Thus, this embodiment realizes enhancement in the mechanical strength and the stable efficiency of the forced air cooling as well as the shielding of the internally generated electro magnetic interference without greatly narrowing the inner space, even though the bottom plate 11BP, the reinforcing frame 11ST, the top cover 13, and the power supply covers 14C-*b* are formed of thin metal plates.

Therefore, an electronic device to which this embodiment is applied is able to reduce its size and weight with low cost without any deterioration in performance, and it also can have considerably higher density assembly than that in conventional examples with relaxation of restrictions on thermal design.

[Second Embodiment]

Hereinafter, the second embodiment of the present invention will be explained with reference to FIG. 1 to FIG. 6(*b*).

The characteristics of the second embodiment are the shape, dimension, and pitch of the first slits formed in the partitioning member 11P-C.

The partitioning member 11P-C has first slits having a shape and dimension, and with a pitch to suppress, as described above, the radiation of high-frequency electro magnetic interference to the power supply unit 14-*b* and of low-frequency electro magnetic interference to the printed board 51, and in addition, to form bypass paths coupled to each other with a desired degree of tightness between two ventilation paths from the suction port formed in the front cover 12 to the fans 14F-R, 14F-L.

Incidentally, the first slits in the partitioning members 11P-R, 11P-L may be similarly formed with such shape and dimension and at such a pitch as described above.

In this embodiment, paths for bi-directional ventilation are also formed between the first and second ventilation paths formed respectively by the fans 14F-R, 14F-L provided in the respective two power supply units 14-R, 14-L. For example, in any of the following conditions, these ventilation paths are substantially integrated by the fan 14F-L in the power supply unit 14-L via the first slits formed in the partitioning member 11-C, as shown in FIG. 6(*b*).

(1) Between the power supply units 14-R, 14-L, to operate based on the active redundancy system, only the power supply unit 14-L is mounted and is in normal operation.

(2) Between the power supply units 14-R, 14-L to operate based on active redundancy the fan 14F-R mounted in the power supply unit 14-R is in fault (stopped), and only the power supply unit 14-L is mounted, and in normal operation.

Consequently, according to this embodiment, a fan provided in the power supply unit is able to stably continue forced air cooling with desired efficiency even while the operation relies only on a single power supply unit (including a period when the power supply unit 14-R or 14-L is given maintenance or replaced).

[Third Embodiment]

Figure 7:
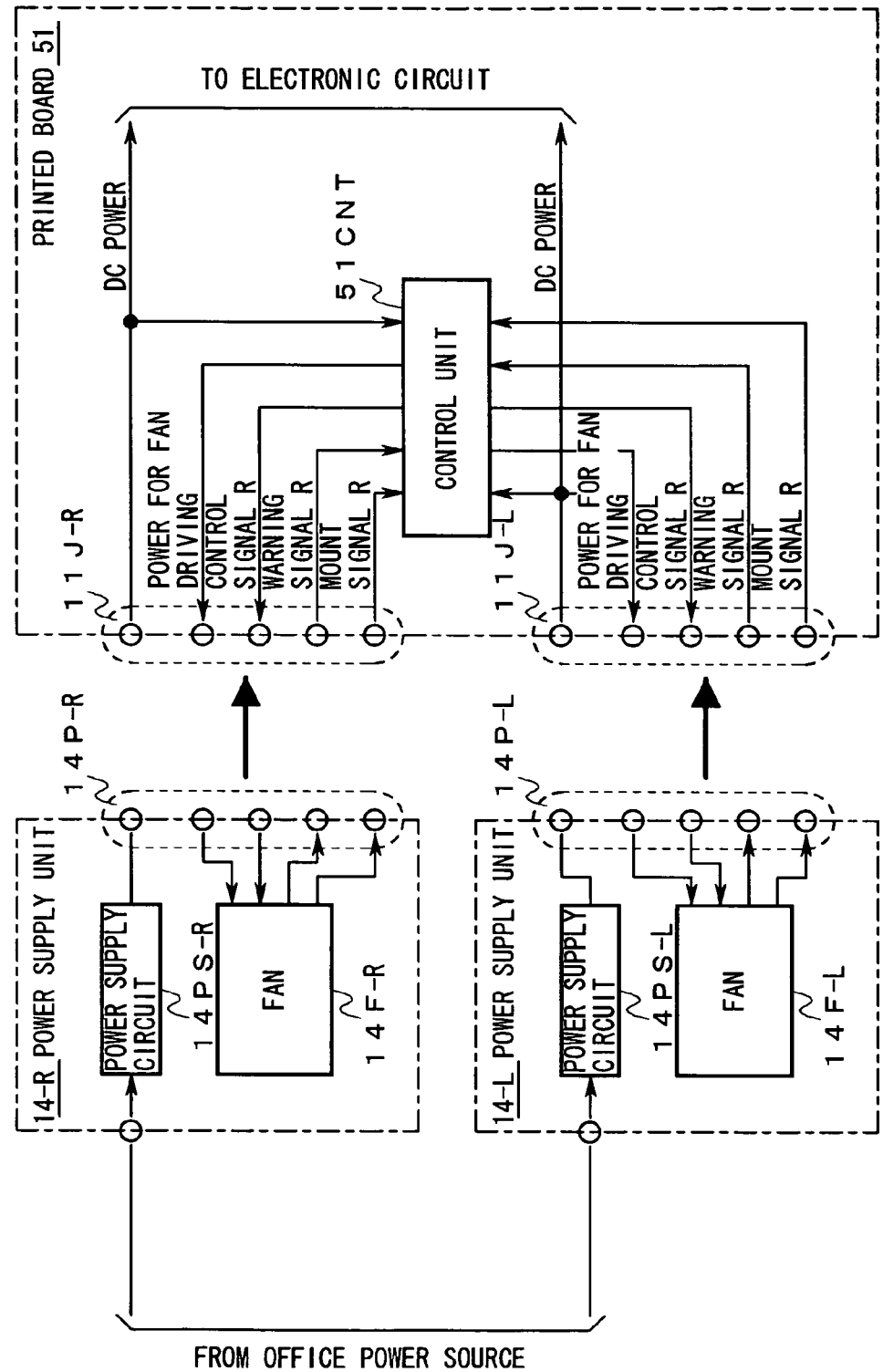
FIG. 7 is a diagram showing the detailed structure of the third embodiment of the present invention.

FIG. 7 is a diagram showing the detailed structure of the third embodiment of the present invention.

In the drawing, an office power source is connected to an input of a power supply circuit 14PS-*b* provided in the power supply unit 14-*b* (disposed on the printed board 14PCB-*b*) via a not-shown terminal board (assumed here to be disposed on the power supply cover 14C-*b*), and an output of the power supply circuit 14PS-*b* is connected to the following terminals provided in the fan 14F-*b* and to a corresponding pin of the connector 14P-*b*.

(1) A terminal used for supplying power (power for fan driving) to the fan 14F-*b*.

(2) A terminal used for supplying a control signal indicating one of two different rotation speeds to be set for the fan 14F-*b* (assumed here for simplicity to indicate that the rotation speed is to be set higher when its logical value is '1' and indicate that the rotation speed is to be set low when its logical value is '0').

(3) A terminal used for supplying a warning signal indicating whether the fan 14F-*b* is in normal operation.

(4) A terminal used for applying a predetermined voltage (hereinafter, a signal indicating one of two different states, namely, whether such a voltage is applied or not, is referred to as a mount signal) to an exterior of the fan 14F-*b* (power supply unit 14-*b*) only when the fan 14F-*b* (power supply unit 14-*b*) is mounted.

On the printed board 51 disposed are the aforesaid electronic circuit to which power is supplied in parallel by the power supply units 14-R, 14-L via the aforesaid connectors 11J-R, 11J-L, and a control unit 51CNT supplied with power along with the electronic circuit and exchanging the aforesaid control signal, warning signal, and mount signal with the fans 14F-R, 14F-L via the connectors 11J-R, 11J-L.

Note that, hereinafter, the control signal, the warning signal, and the mount signal supplied via a connector 14P-R and the connector 11J-R will be referred to as a control signal R, a warning signal R, and a mount signal R respectively, and the control signal, the warning signal, and the mount signal supplied via a connector 14P-L and the connector 11J-L will be referred to as a control signal L, a warning signal L, and a mount signal L respectively.

Figure 8:
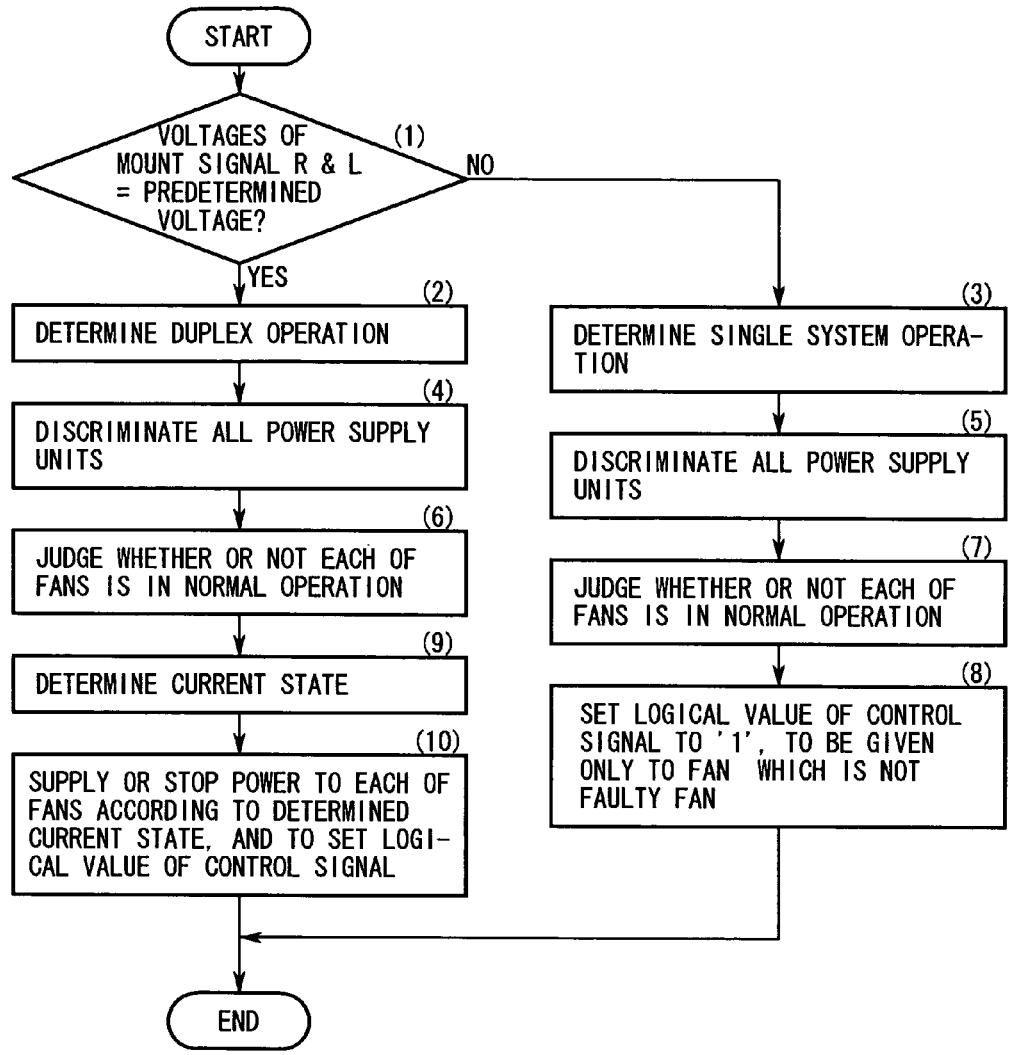
FIG. 8 is a flowchart of the operation of the third embodiment of the present invention.

FIG. 8 is a flowchart of the operation of the third embodiment of the present invention.

FIG. 9 is a table to explain the operation of the third embodiment of the present invention.

Hereinafter, the operation of this embodiment will be explained with reference to FIG. 7 to FIG. 9 as well as to FIG. 1 and FIG. 2.

The control unit 51CNT monitors the aforesaid warning signal R, mount signal R, warning signal L, and mount signal L at a predetermined frequency and judges whether or not power is normally supplied by each of the power supply units 14-R, 14-L. The control unit 51CNT further performs the following operations according to the results of such monitoring and judgment.

(1) Determination of the system configuration of the power supply units

To judge whether or not voltages of the mount signal R, and the mount signal L are equal to the aforesaid predetermined voltage ((1) in FIG. 8):

If the results of the judgments are YES, to determine that the power supply units 14-R, 14-L are operating based on active redundancy (hereinafter, referred to as duplex operation) ((2) in FIG. 8); and If, on the other hand, one of the judgment results is NO, to discriminate the corresponding power supply unit (hereinafter, referred to as an unmounted power supply unit), and to determine that the electronic circuit operates with one of the power supply units 14-R, 14-L not mounted (hereinafter, referred to as single system operation) ((3) in FIG. 8).

(2) Judgment on whether or not the power supply units are in normal operation

To determine whether the power supply units 14-R, 14-L are normally supplying power (hereinafter, referred to as normal power supply units) based on the difference between the voltages of power supply lines connected to outputs, and proper values of the voltages ((4) and (5) in FIG. 8).

(3) Judgment on whether or not the fans are in normal operation:

To judge whether or not each of the fans 14F-R, 14F-L is in normal operation, based on the logical values of the warning signal R and the warning signal L; and To discriminate the fan(s) with a negative judgment result (hereinafter, referred to as faulty fans) from the fans 14F-R, 14F-L ((6) and (7) in FIG. 8).

(4) In the single system operation, to set the logical value of the control signal to '1' (indicating that the rotation speed is set high), the control signal being to be given only to either of the fans 14F-R, 14F-L which is provided in the one determined as normal and is not the faulty fan.

(5) In the duplex operation, to determine in what state the power supply units 14-R, 14-L are at this moment (hereinafter, referred to as a current state) from the following states ((9) in FIG. 8):

A first state in which both of the power supply units 14-R, 14-L are normal and neither of the fans 14F-R, 14F-L respectively provided therein are the faulty fans ((3) in FIG. 9);

A second state in which one of the power supply units 14-R, 14-L is not normal and neither of the fans 14F-R, 14F-L respectively provided therein are the faulty fans ((4) and (5) in FIG. 9);

A third state in which one of the fans 14F-R, 14F-L is the faulty fan ((6) and (7) in FIG. 9).

(6) To supply or stop power to each of the fans 14F-R, 14F-L according to the determined current state, and to set the logical value of the control signal ((10) in FIG. 8):

If the current state is the first state, to supply power to both of the fans 14F-R, 14F-L in parallel and to set the logical value of the control signal to '0' (indicating that the rotation speed is set low) and give the set signal to the fans 14F-R, 14F-L;

If the current state is the second state, to supply power to both of the fans 14F-R, 14F-L by the normal power supply unit, and to set the logical value of the control signal to '0' (indicating that the rotation speed is set low) and give the set signal to the fans 14F-R, 14F-L; and If the current state is the third state, to supply power only to one of the fans 14F-R, 14F-L, being not the faulty fan (hereinafter, referred to as a normal fan) and to set the logical value of the control signal to '1' (indicating that the rotation speed is set high) and to give the set signal to this normal fan.

That is, one of the fans 14F-R, 14F-L in normal operation is continuously given power by the normal power supply unit(s) (both or one of the fans 14F-R, 14F-L), and is set to have a high operation speed only while the other fan is in fault in the duplex operation or during the single system operation. Thus, according to this embodiment, increasing the rotation speed of the normal fan can compensate a decrease in the efficiency of the forced air cooling due to the faulty fan.

Moreover, compared with the above-described second embodiment, according to this embodiment it is possible to maintain high efficiency of the forced air cooling of the electronic circuit disposed on the printed board 51, or relax restrictions on the thermal design and component arrangement of the electronic circuit. It is also possible to enhance total reliability of the electronic circuit without excessive increase in power consumption or the provision of a large fan.

Note that in this embodiment, the control unit 51CNT is mounted on the printed board 51 together with the aforesaid electronic circuit. However, the present invention is not limited to such structure, and, for example, the control unit 51CNT may be disposed on a printed board different from the printed board 51 and supported by the reinforcing frame 11ST or the like, or two control units are separately disposed on the printed board 14PCB-R, 14PCB-L provided in the power supply units 14-R, 14R-L respectively.

Further, in each of the above-described embodiments, the fans 14F-R, 14F-L are provided in the power supply units 14-R, 14-L respectively. However, the present invention is not limited thereto. For example, the power supply units 14-R, 14-L may be structured without the respective fans 14F-R, 14F-L, and different fans are attached onto the bottom plate 111 BP instead together with any one of the partitioning members 11P-R, 11P-C, 11P-L which may not have the aforesaid first slits formed therein.

Further, in each of the above-described embodiments, the reinforcing frame 11ST is inserted between the inner wall of the top cover 13 and the support metal fitting 13P, so as to secure the strength of the top cover 13 and electrically connect the reinforcing frame 11ST, at low impedance, to the top cover 13 which is necessary for shielding the high-frequency electro magnetic interference.

However, the present invention is not limited to the above structure and, for example, it may be structured that in place of the support metal fitting 13P, a conductive pin with the largest diameter at its top portion is protrudingly provided on the inner wall of the top cover 13, and the reinforcing frame 11ST may have a notch to be engaged with the side wall and the top portion of this pin.

Further, in each of the above-described embodiments, the partitioning member 11P-C may not include the first slits if, for example, the electronic circuit only operates in the aforesaid duplex operation, or the first slots may be large enough to allow the low-frequency electro magnetic interference to propagate to/from the power supply units 14-R, 14-L via the partitioning member 11P-C.

Further, in each of the above-described embodiments, in place of or in addition to the first slits formed in the partitioning member 11P-C, for example, slits similar to the first slits may be formed in corresponding side faces of the power supply units 14-R, 14-L.

Moreover, the present invention is not limited to the case where the power supply units 14-R, 14-L operate based on active redundancy in principle, and is similarly applicable to a case where the number of power supply units mounted similarly to the power supply units 14-R, 14-L is one, or to a case where a plurality of power supply units are provided and operate based on a system other than the active redundancy system (for example, standby redundancy or N+1 stand-by system).

Further, in each of the above-described embodiments, the top cover 13 is tightly fixed onto the base 11 by screwing. However, the present invention is not limited to such structure, and for example, the top cover 13 and the base 11 may be constituted as an integrated cylinder as long as the printed board 51 can be contained in a predetermined location of an inner portion (a hollow portion) thereof.

Moreover, in each of the above-described embodiments, the power supply units 14-R, 14-L are mounted at a center portion of one face of the box-shaped cabinet with a predetermined interval. However, the present invention is not limited to such structure, and such power supply units are mounted at any one of the corners of the aforesaid box-shaped cabinet.

Further, in each of the above-described embodiments, the present invention is applied to the cabinet in a rectangular parallelepiped shape containing the printed board 51. However, the present invention is not limited thereto, and applicable to a cabinet in any shape and dimension.

The invention is not limited to the above embodiments and various modifications may be made without departing from the spirit and scope of the invention. Any improvement may be made in part or all of the components.

What is claimed is:

1. A cabinet comprising:
a conductive housing having an aperture with a folded edge folded approximately 180 degrees, an additional device being fitted into the aperture by insertion, the conductive housing containing an electronic device, the additional device operating in parallel with the electronic device; and
a reinforcing member supported with a portion of an inner wall of said housing, the reinforcing member disposed on a boundary between two areas inside said housing, said electronic device and said additional device being placed in said two areas, respectively, the portion of the inner wall being more inside than the folded edge of said aperture.

2. A cabinet comprising:
a conductive housing having an aperture with a folded edge folded approximately 180 degrees, a plurality of additional devices being fitted together into the aperture by insertion, the conductive housing containing an electronic device, the plurality of additional devices operating in parallel with the electronic device; and
a reinforcing member supported with a portion of an inner wall of said housing, the reinforcing member disposed on a boundary between two areas inside said housing, said electronic device and all of said additional devices being placed in said two areas, respectively, the portion of the inner wall being more inside than the folded edge of said aperture.

3. The cabinet according to claim 2, further comprising a partitioning member partitioning said aperture into areas into which said plurality of additional devices are fitted by insertion, respectively, said partitioning member being a bypass for forced air cooling of said electronic device among the areas, wherein each of said plurality of additional devices includes a fan used for forced air cooling of said electronic device.

4. The cabinet according to claim 2, further comprising:
a partitioning member partitioning said aperture into areas into which said plurality of additional devices are fitted by insertion, said partitioning member being a bypass for forced air cooling of said electronic device among the areas; and
a control unit maintaining efficiency of the forced air cooling within a prescribed range by one of increasing and decreasing rotation speed of fans provided in the plurality of additional devices, the one of increasing and decreasing rotation speed depending on one of a number of the fans and operational conditions of the fans.

5. The cabinet according to claim 1, wherein
said housing includes a covering member having an edge being all or part of the folded edge of said aperture, said covering member being used for opening/closing the two areas and detachably supporting said reinforcing member.

6. The cabinet according to claim 2, wherein
said housing includes a covering member having an edge being all or part of the folded edge of said aperture, said covering member being used for opening/closing the two areas and detachably supporting said reinforcing member.

7. The cabinet according to claim 5, wherein:
said reinforcing member adjacent to said covering member has a specific edge which is shaped to be in parallel with the covering member; and
said covering member has a member to support the specific edge of said reinforcing member by pinching.

8. The cabinet according to claim 6, wherein:
said reinforcing member adjacent to said covering member has a specific edge which is shaped to be in parallel with the covering member; and
said covering member has a member to support the specific edge of said reinforcing member by pinching.

9. The cabinet according to claim 1, wherein
said reinforcing member has an opening for heat release from said electronic device to said aperture and for suppressing radiation of electromagnetic interference generated in the electronic device to the aperture.

10. The cabinet according to claim 2, wherein
said reinforcing member has an opening for heat release from said electronic device to said aperture and for suppressing radiation of electromagnetic interference generated in the electronic device to the aperture.

11. An additional device comprising:
a circuit operating in parallel with an electronic device contained in a first conductive cabinet having a first aperture with a folded edge; and
a second conductive cabinet having a second aperture to be fitted into the first aperture by insertion, and containing said circuit.

12. The additional device according to claim 11, wherein said circuit supplies power to said electronic device.

13. The additional device according to claim 12, further comprising
a fan used for forced air cooling of said electronic device via the second aperture.

14. The additional device according to claim 13, wherein said second conductive cabinet has a third aperture to serve as a bypass for ventilation in a process of said forced air cooling, the third aperture being provided between the additional device and another additional device disposed adjacent to the additional device.

15. The additional device according to claim 13, further comprising
a control unit maintaining efficiency of the forced air cooling within a prescribed range by one of increasing and decreasing rotation speed of fans according to operational conditions of the fans, said fans being fitted together into the first aperture of said first cabinet by insertion and provided in a specific additional device and another additional device.

* * * * *